Feb. 16, 1960 W. L. FIRESTONE 2,925,562

FREQUENCY MODULATED CRYSTAL OSCILLATOR CIRCUIT

Filed Sept. 28, 1956

INVENTOR.
William L. Firestone
BY
Mueller & Aichele
Attys.

United States Patent Office 2,925,562

Patented Feb. 16, 1960

2,925,562

FREQUENCY MODULATED CRYSTAL OSCILLATOR CIRCUIT

William L. Firestone, Highland Park, Ill., assignor to Motorola, Inc., Chicago, Ill., a corporation of Illinois Application September 28, 1956, Serial No. 612,861

8 Claims. (Cl. 332—26)

This invention relates generally to crystal controlled oscillators and more particularly to such an oscillator the frequency of which can be directly varied by control signals to provide frequency modulation of the oscillator or frequency control thereof.

Radio transmitters must be very carefully controlled so that the signals therefrom are held within channels which are defined by the Federal Communications Commission. Such control is also necessary to maintain the transmitters at prescribed frequencies so that receivers can be easily tuned to receive the signals therefrom. Piezo-electric crystals have been used for controlling the frequencies of the oscillators which in turn establish the frequency of the radio transmitters.

In certain transmitters, the frequency of the wave is varied to transmit information thereover. That is, the frequency may be varied on either side of a center frequency to provide what is termed frequency modulation. It may also be desired to provide control of the frequency of a crystal oscillator in a slowly varying manner to hold the oscillator in synchronism with other equipments. As an example, such control may be used for holding the frequency of the local oscillator in a receiver at the proper frequency so that the receiver is accurately tuned to a transmitter with which it is operating.

The requirements for an oscillator having a stable center frequency and permitting wide variations from the center frequency are basically inconsistent and circuits for accomplishing these results have been quite complex and expensive. In many cases a constant frequency is first produced with the frequency being later varied in phase by a separate modulator, so that two separate elements are required to provide the desired controlled frequency variations.

It is, therefore, an object of the present invention to provide an improved directly modulated crystal oscillator.

A further object of the invention is to provide an improved oscillation control circuit which maintains a desired center frequency and provides wide deviation in response to modulating signals.

Another object of the invention is to provide a simple and improved crystal oscillator wherein the frequency of the oscillator is variable in response to variation of an element in the frequency control circuit of the oscillator.

A feature of the invention is the provision of a crystal oscillator having an oscillation control circuit including a crystal and a series resonant circuit which is tunable through a range including the series resonant frequency of the crystal.

Another feature of the invention is the provision of a crystal oscillator having an oscillation control circuit with a crystal connected in series with a series resonant circuit, with one element of the series resonant circuit being variable in response to a control signal to vary the tuning of the series resonant circuit in a range about the series resonant frequency of the crystal to thereby cause variations in the output frequency of the oscillator. The variable reactance element of the circuit may take many forms such as the capacity of an electron valve, a saturable reactor, or an inductor or capacitor bridged by a rectifier and partially shorted thereby.

Further objects, features, and the attending advantages of the invention will be apparent from a consideration of the following description when taken in connection with the accompanying drawings in which.

In practicing the invention, there is provided an electron oscillator having a frequency controlling circuit including a crystal and a series resonant circuit connected in series therewith. The series resonant circuit includes a variable tuning element and is tunable through a range of frequencies including the series resonant frequency of the crystal. This produces a phase shift in the frequency controlling circuit which causes a change in frequency of the oscillator. An inductor may be bridged across the crystal to neutralize the shunt capacity of the crystal and of the holder thereof. The variable element of the series resonant circuit may be a variable capacity which may be provided by the reactance of an electron discharge valve. Alternatively, the frequency controlling circuit may include a variable inductor such as a saturable reactor. The inductor and capacitor of the series resonant circuit may both be effectively varied by providing diodes thereacross which are selectively rendered conducting to change the effective value of the elements and thereby change the frequency of oscillation.

Figure 1:
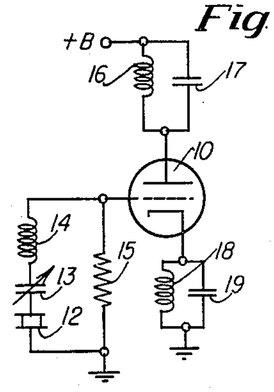
Fig. 1 shows a simplified oscillator circuit in accordance with the invention.

Referring now to the drawings, in Fig. 1 there is illustrated an oscillator including the frequency controlling circuit in accordance with the invention. The oscillator illustrated is a simple triode oscillator including an electron valve 10 to the grid of which the frequency controlling circuit is connected. This circuit includes crystal 12, capacitor 13, and inductor 14, all connected in series from the grid of the valve to ground. Resistor 15 provides a direct current path for the grid but may be so large that it has substantially no effect on the frequency controlling circuit. A tuned circuit including inductor 16 and capacitor 17 is connected to the plate and a further tuned circuit including inductor 18 and capacitor 19 is connected to the cathode. Feedback is provided through the interelectrode capacity of the valve. In some circuits, it may be necessary to provide external capacity between the plate and grid and/or between the grid and cathode to supplement the interelectrode capacity. This will depend upon the particular valve used and the frequency involved.

The crystal 12 in the frequency controlling circuit is operated at its series resonant point. Condenser 13 and inductor 14 form a series resonant circuit which is resonant substantially at the frequency of the series resonant point of the crystal. Accordingly, at the series resonant frequency of the crystal, which is also the series resonant frequency of the resonant circuit, the impedance of the grid circuit of tube 10 is very low. The tuned circuits 16, 17 and 18, 19 determine in a general way the frequency of oscillations. The frequency controlling circuit including the crystal, however, has a much higher Q than the other tuned circuits so that this circuit controls the precise frequency of operation of the oscillator.

Accordingly, oscillations are produced at the series resonant frequency of the crystal.

In the circuit of Fig. 1, the capacitor 13 is shown as a variable element. Accordingly, this element can be used to de-tune the series resonant circuit to produce a phase shift in the grid circuit. The crystal will compensate for the phase shift by shifting from the series resonant point so that a new frequency of oscillation is established. Accordingly, by change of value of the capaitor 13, the frequency of oscillation can be changed.

Figure 2:
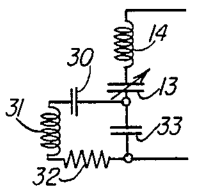
Fig. 2 is the equivalent circuit of the frequency controlling circuit of the oscillator of Fig. 1.

Fig. 2 shows the equivalent circuit diagram of the frequency controlling circuit with the crystal 12 being replaced by condenser 30, inductor 31, and resistor 32 in series and condenser 33 in shunt. It will be apparent from this equivalent circuit that the resonant frequency of the entire frequency controlling circuit is changed by a change in the value of condenser 13. It will be obvious that the same result produced by changing the condenser 13 can be produced by changing the inductor 14 similarly to change the resonant frequency of the frequency controlling circuit.

Figure 3:
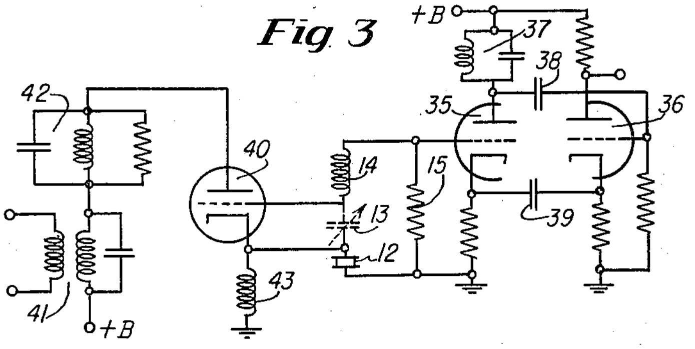
Fig. 3 is a circuit wherein an electron valve form a variable capacitor.

In Fig. 3 is shown an embodiment of the invention wherein an oscillator of a definite type is used. In this circuit, a two-tube oscillator is illustrated which is of the type disclosed and claimed in Bowser Patent 2,740,891 assigned to the assignee of the present invention. The oscillator includes electron valve 35 which functions as a grounded grid amplifier and valve 36 which provides feed-back for substaining oscillations in the valve 35. A tuned circuit 37 is connected to the anode of valve 35, and the anode is coupled through condenser 38 to the grid of valve 36. Valve 36 acts as a cathode follower and provides feedback through capacitor 39 to the cathode of valve 35.

The frequency controlling circuit of Fig. 3 is similar to that shown in Fig. 1 and the same reference numerals are applied to corresponding parts. The variable condenser 13 (shown dotted) is formed by the grid-to-cathode capacity of tube 40. Of course, a small fixed capacitor may be added across this grid-cathode capacity if desired. While this added capacity will somewhat decrease the deviation range it will add stability to the circuit by minimizing long term tube variations, also it provides an additional means for controlling the deviation. An input transformer 41 is connected in series with tuned circuit 42 to the plate of the tube 40, and the cathode is grounded through inductor 43. By applying a modulating signal to the transformer 41, the capacity between the grid and cathode of tube 40 is changed to thereby change the tuning of the resonant circuit in series with the crystal 12. (This is in accordance with the well known Miller effect.) This will produce modulation of the frequency of the crystal in a manner previously described. The inductor 43 connected to the cathode of tube 40 in addition to completing the circuit for the tube, also serves to neutralize the shunt capacity of the crystal 12. This may include both the internal capacity of the crystal and the capacity of the holder.

Figure 4:
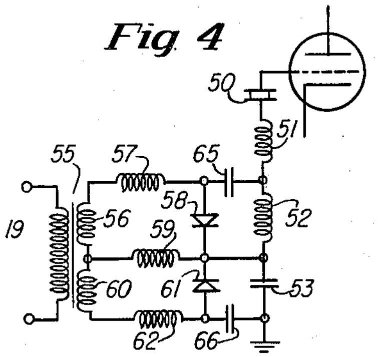
Fig. 4 is a circuit in which the coil and condenser of a resonant circuit are selectively shorted by rectifiers.

Fig. 4 shows a still further embodiment of the invention wherein a somewhat different frequency controlling circuit is shown which may be used in an oscillator of a type generally shown in either Fig. 1 or Fig. 3. The frequency controlling circuit includes crystal 50, coils 51 and 52, and condenser 53. Coils 51 and 52 and condenser 53 form a series resonant circuit having the same resonant frequency as the series resonant frequency of the crystal 50. The frequency of the oscillator may be varied by controlling the effective values of the inductor 52 and the condenser 53. This is accomplished by the modulating circuit including transformer 55, having a center tapped secondary with a portion 56 connected through choke 57, rectifier 58, and choke 59, and a portion 60 connected through choke 59, rectifier 61, and choke 62. Modulating signals applied to the transformer 55 will selectively render the rectifiers 58 and 61 conducting, and these rectifiers are connected in series with condensers 65 and 66 respectively cross the inductor 52 and capacitor 53. Accordingly, as the rectifiers 58 and 61 are selectively rendered conducting, they will effectively tend to short this inductor 52 and capacitor 53 respectfully, to change the effective values thereof. It will be noted that the rectifiers 58 and 61 are connected in opposite polarities so that they will be alternatively operated by half cycles of the wave. This will cause the inductor and the capacitor to be selectively decreased on alternate half-cycles to provide a symmetrical shift of the frequency of the oscillator about a center point.

Figure 5:
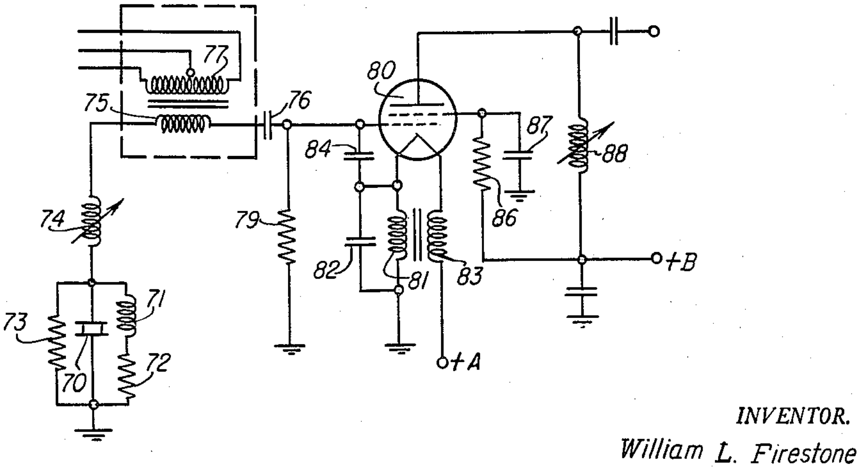
Fig. 5 is an oscillator circuit in accordance with the invention using a saturable reactor modulator and a directly heated discharge tube.

Fig. 5 shows a further oscillator circuit in accordance with the invention in which an oscillator of a different type is provided. In this circuit, the frequency controlling circuit includes crystal 70 having inductor 71 connected thereto for neutralizing the shunt capacity of the crystal and the capacity of the holder, and resistors 72 and 73 for damping out undesired oscillations. Connected in series with the crystal is variable inductor 74, saturable reactor 75, and condenser 76. The elements 74, 75, and 76 form a resonant circuit tuned to a frequency substantially the same as the series resonant frequency of the crystal. The element 75 is the coil of a saturable reactor having an input winding 77 to which modulating signals are applied. The frequency controlling circuit is connected to the grid of a pentode tube 80 which serves as a single tube oscillator. The cathode of the tube 80 is connected to ground through resonant circuit including coil 81 and condenser 82. Coil 81 is wound as a bifilar winding with coil 83 and these coils provide a circuit for applying heater current to the cathode of tube 80. The grid of tube 80 is grounded through resistor 79 and the grid and cathode are connected through condenser 84. The screen grid of the tube is connected to B-plus potential through resistor 86 and is bypassed by condenser 87. B-plus potential is also applied to the plate of tube 80 through choke 88 which along with stray and tube capacity offers a high impedance at the output frequency.

The saturable reactor 75 provides a change in the inductance in the series resonant circuit, which is connected in series with crystal 70, in response to application of modulating signals thereto. This produces a phase shift in the frequency controlling circuit which causes the crystal to shift its series resonant point so that the frequency of oscillation is varied. By biasing the saturable reactor it is possible to provide a shift in inductance about a central point so that the frequency of the oscillator will shift with respect to a center frequency. The oscillator therefore may be used to provide frequency modulation in response to the modulating signal.

The oscillators illustrated have been described in particular as providing a frequency modulated output in response to the application of modulating signals thereto, but may also be used to provide slowly varying control of a crystal controlled oscillator. For example, instead of applying modulating signals to the system of Fig. 2, a slowly varying direct current may be applied to provide automatic frequency control of the output of the oscillator. Similarly, in Figs. 4 and 5, a slowly varying control of the oscillator frequency may be provided as well as a dynamic variation or modulation of the oscillator frequency.

The oscillators in accordance with the invention have been found to provide wide deviations of the center frequency of the oscillators so that the necessary deviation for signal transmission can be produced without a large number of multiplier stages. This greatly simplifies the transmitting equipment in which such as oscillator is used. Also, since a separate modulator is not required, the transmitter circuit is further simplified to greatly reduce the cost of the overall equipment.

I claim:

1. A frequency modulated oscillator including in combination, an oscillation control circuit including a crystal unit having a series resonant frequency and a series resonant circuit portion connected in series with said crystal unit, said oscillation control circuit having first and second terminals between which said crystal unit and said series resonant circuit portion are connected in series, said series resonant circuit portion including reactance means providing resonance in said circuit portion substantially at the series resonant frequency of said crystal unit, said reactance means including at least one element which is variable to change the tuning of said series resonant circuit portion, and means including an electron device coupled to said oscillation control circuit to form a circuit in which oscillations are produced, with the frequency of such oscillations being controlled by said variable element, said last named means being coupled to said first and second terminals to form the sole coupling between said electron device and said oscillation control circuit.

2. A frequency modulated oscillator including in combination, an oscillation control circuit including a crystal having a series resonant frequency and a series resonant circuit portion connected in series with said crystal, said oscillation control circuit having first and second terminals between which said crystal and said series resonant circuit portion are connected in series, said series resonant circuit portion including reactance means providing resonance in said circuit portion substantally at the series resonant frequency of said crystal, said reactance means including signal input means and having a value which varies in accordance with a signal applied to said input means, and means including an electron device coupled to said oscillation control circuit to sustain oscillations therein, with the frequency of such oscillations varying with the signal applied to said reactance means, said means including an electron device being coupled to said first and second terminals to form the sole coupling between said electron device and said oscillation control circuit.

3. A frequency modulated oscillator including in combination, an oscillation control circuit including a crystal having a series resonant frequency and a series resonant circuit portion connected in series with said crystal, said oscillation control circuit having first and second terminals between which said crystal and said series resonant circuit portion are connected in series, said series resonant circuit portion including reactance means providing resonance in said circuit portion substantially at the series resonant frequency of said crystal, said reactance means including a signal input portion and having a value which varies in accordance with a signal applied thereto, and means including an electron device coupled to said oscillation control circuit to form a circuit in which oscillations are produced, with the frequency of such oscillations varying with the signal applied to said reactance means, said means including an electron device being coupled to said first and second terminals to form the sole coupling between said electron device and said oscillation control circuit.

4. A frequency modulated oscillator including in combination, an oscillation control circuit including a crystal having a series resonant frequency and a series resonant circuit portion connected in series with said crystal, said oscillation control circuit having first and second terminals between which said crystal and said series resonant circuit portion are connected in series, said series resonant circuit portion including reactance means providing resonance in said circuit portion substantially at the series resonant frequency of said crystal, said reactance means including an electron device including a plurality of electrodes with a pair of said electrodes being connected in said series resonant circuit and providing capacity therebetween which varies in accordance with a signal applied to an electrode of said device, and means including a second electron device coupled to said oscillation control circuit to form a circuit in which oscillations are produced with the frequency of such oscillations varying with the signal applied to said reactance means, said second electron device including a pair of electrodes which are coupled to said first and second terminals to form the sole coupling between said second electron device and said oscillation control circuit.

5. A frequency modulated oscillator including in combination, an oscillation control circuit including a crystal having a series resonant frequency and a series resonant circuit portion connected in series with said crystal, said oscillation control circuit having first and second terminals between which said crystal and said series resonant circuit portion are connected in series, said series resonant circuit portion including reactance means providing resonance in said circuit portion substantially at the series resonant frequency of said crystal, said reactance means including a reactive element having a rectifier bridged thereacross and a signal input portion connected to said rectifier for selectively rendering the same conductive in accordance with a signal applied thereto, whereby said rectifier selectively shorts said reactive element to change the effective value thereof, and means including an electron device coupled to said oscillation control circuit to form a circuit in which oscillations are produced, with the frequency of such oscillations varying with the signal applied to said reactance means, said means including an electron device being coupled to said first and second terminals to form the sole coupling between said electron device and said oscillation control circuit.

6. A frequency modulated oscillator including in combination, an oscillation control circuit including a crystal having a series resonant frequency and a series resonant circuit portion connected in series with said crystal, said oscillation control circuit having first and second terminals between which said crystal and said series resonant circuit portion are connected in series, said series resonant circuit portion including reactance means providing resonance in said circuit portion substantially at the series resonant frequency of said crystal, said reactance means including a saturable reactor having a coil connected in said resonant circuit portion and a signal input portion, with the inductance of said coil having a value which varies in accordance with a signal applied to said input portion, and means including an electron device coupled to said oscillation control circuit to form a circuit in which oscillations are produced, with the frequency of such oscillations varying with the signal applied to said reactance means, said means including an electron device being coupled to said first and second terminals to form the sole coupling between said electron device and said oscillation control circuit.

7. A frequency modulated oscillator including in combination, an oscillation control circuit including a crystal unit having a series resonant frequency and a series resonant circuit portion providing resonance substantially at the series resonant frequency of said crystal, said oscillation control circuit including first and second terminals with said crystal unit and said resonant circuit portion being connected in series therebetween, said series resonant circuit portion including capacitor means and inductor means, first and second rectifier means individually bridged across said capacitor means and said inductor means respectively, means including a signal input portion coupled to said rectifier means for selectively rendering said rectifier means conducting in response to a signal applied to said signal input portion, said rectifier means varying the effective value of said capacitor means and said inductor means in alternate half cycles of the signal aplied to said signal input portion, an electron device having a pair of electrodes coupled to said first and second terminals of said oscillation control circuit and forming the sole connection between said electron device and said oscillation control circuit, and means including said electron device and said oscillation control circuit forming an oscillator for producing oscillations the frequency of which varies with the signal applied to said signal input portion.

8. A frequency modulated oscillator including in combination, an oscillation control circuit including a crystal having a series resonant frequency and a series resonant circuit portion connected in series with said crystal, said oscillation control circuit having first and second terminals between which said crystal and said series resonant circuit portion are connected in series, said series resonant circuit portion inclding reactance means providing resonance in said circuit portion substantially at the series resonant frequency of said crystal, said reactance means having a pair of electrodes providing capacity therebetween which varies in accordance with a signal applied thereto, means connecting said electrodes in said series resonant circuit, and means including an electron device coupled to said oscillation control circuit to form a circuit in which oscillations are produced, with the frequency of such oscillations varying with the signal applied to said reactance means, said means including an electron device being coupled to said first and second terminals to form the sole coupling between said electron device and said oscillation control circuit.

References Cited in the file of this patent

UNITED STATES PATENTS

| | | |
|---|---|---|
| 2,064,013 | Kinn | Dec. 15, 1936 |
| 2,424,246 | Mason | July 22, 1947 |
| 2,708,739 | Bucker | May 17, 1955 |